United States Patent
Hasegawa

(10) Patent No.: US 7,192,887 B2
(45) Date of Patent: Mar. 20, 2007

(54) SEMICONDUCTOR DEVICE WITH NITROGEN IN OXIDE FILM ON SEMICONDUCTOR SUBSTRATE AND METHOD OF MANUFACTURING THE SAME

(75) Inventor: Eiji Hasegawa, Kawasaki (JP)

(73) Assignee: NEC Electronics Corporation (JP)

( * ) Notice: Subject to any disclaimer, the term of this patent is extended or adjusted under 35 U.S.C. 154(b) by 55 days.

(21) Appl. No.: 10/768,611

(22) Filed: Jan. 29, 2004

(65) Prior Publication Data

US 2004/0185676 A1  Sep. 23, 2004

(30) Foreign Application Priority Data

Jan. 31, 2003 (JP) ............................ 2003-024718
Dec. 8, 2003 (JP) ............................ 2003-408813

(51) Int. Cl.
*H01L 21/31* (2006.01)
*H01L 21/469* (2006.01)

(52) U.S. Cl. .................. 438/769; 438/411; 438/770; 257/506; 257/E21.193; 257/E21.268; 257/E21.285; 257/524

(58) Field of Classification Search ................ 438/411, 438/769, 770; 257/E21.193, E21.268, E21.285, 257/506, 524
See application file for complete search history.

(56) References Cited

U.S. PATENT DOCUMENTS

| | | | | |
|---|---|---|---|---|
| 6,136,654 A * | 10/2000 | Kraft et al. | .................. | 438/287 |
| 6,399,445 B1 * | 6/2002 | Hattangady et al. | ......... | 438/261 |
| 6,794,312 B2 * | 9/2004 | Abdul-Hak et al. | ......... | 438/769 |
| 6,803,330 B2 * | 10/2004 | Ramkumar et al. | ......... | 438/783 |
| 6,893,979 B2 * | 5/2005 | Khare et al. | ................. | 438/769 |
| 2003/0148628 A1 * | 8/2003 | Tay et al. | .................... | 438/769 |
| 2003/0157771 A1 * | 8/2003 | Louh et al. | ................. | 438/287 |
| 2003/0157773 A1 * | 8/2003 | Hu et al. | .................... | 438/287 |
| 2004/0023454 A1 * | 2/2004 | Yao et al. | .................... | 438/216 |
| 2004/0235311 A1 * | 11/2004 | Nakanishi et al. | .......... | 438/775 |
| 2005/0153569 A1 * | 7/2005 | Sandhu et al. | .............. | 438/774 |

FOREIGN PATENT DOCUMENTS

| | | |
|---|---|---|
| JP | 2-18934 | 1/1990 |
| JP | 5-218405 | 8/1993 |
| JP | 11-67760 | 3/1999 |
| JP | 2000-294550 | 10/2000 |
| JP | 2000-332009 | 11/2000 |

OTHER PUBLICATIONS

Wolf and Tauber; Silicon Processing for the VLSI Era vol. 1: Process Technology; pp. 57-58; First Ed. 1986; Lattice Press; Sunset Beach, CA.*

* cited by examiner

*Primary Examiner*—Michelle Estrada
*Assistant Examiner*—Fernando L. Toledo
(74) *Attorney, Agent, or Firm*—Ostrolenk, Faber, Gerb & Soffen, LLP

(57) ABSTRACT

A method of manufacturing a MOS transistor is provided that achieves high-speed devices by reducing nitrogen diffusion to a silicon substrate interface due to redistribution of nitrogen and further suppressing its diffusion to a polysilicon interface, which prevents realization of faster transistors. An oxide film is exposed to a nitriding atmosphere to introduce nitrogen into the oxide film, and a thermal treatment process is performed in an oxidizing atmosphere. The thermal treatment process temperature in the oxidizing atmosphere is made equal to or higher than the maximum temperature in all the thermal treatment processes that are performed later than that thermal treatment process step.

22 Claims, 9 Drawing Sheets

SEMICONDUCTOR DEVICE WITH NITROGEN IN OXIDE FILM ON SEMICONDUCTOR SUBSTRATE AND METHOD OF MANUFACTURING THE SAME

BACKGROUND OF THE INVENTION

1. Field of the Invention

The present invention relates to a method of manufacturing a semiconductor device, and more particularly to a method of forming a gate insulating film on a semiconductor substrate.

2. Description of the Prior Art

There has been a demand for a manufacturing method capable of manufacturing transistors having high-operating speed and high-reliability at good controllability. To increase the operating speed of MIS (Metal Insulator Semiconductor) type transistors, the thickness of the gate insulating film needs to be reduced; however, various problems arise in the course. For example, one of the problems is that boron diffuses from the p-type gate electrode into the substrate. As a method for solving this problem, Japanese Unexamined Patent Publication No. 11-67760 suggests a method in which a gate oxide film is subjected to a thermal treatment process in an atmosphere such as $N_2O$ or NO to introduce nitrogen into the gate oxide film. By providing a layer in which nitrogen is contained in the vicinity of the interface of the gate oxide film with the gate electrode at a high concentration, boron diffusion from the gate electrode is suppressed. Regarding a similar method of introducing nitrogen, Japanese Unexamined Patent Publication No. 2-18934 suggests a method using $NH_3$. Additionally in recent years, there has been proposed a method of introducing activated nitrogen formed by a plasma method or the like into the gate oxide film. For example, Japanese Unexamined Patent Publication No. 2000-294550 shows nitridation and oxy-nitridation employing plasma with the use of a planar antenna and microwave, and Japanese Unexamined Patent Publication No. 2000-332009 shows a method of forming a gate oxide film containing nitrogen utilizing generation of stable plasma. In this way, with the rapid advance of thickness reduction of gate oxide films, introduction of nitrogen into a gate oxide film has particularly become a very important issue.

Meanwhile, it has been known that when nitrogen is introduced into a gate oxide film, decrease of carrier mobility is caused and transistor characteristics are degraded if excessive nitrogen that has been introduced into the gate oxide film is present at the interface between the gate oxide film and a semiconductor substrate. To solve this problem, Japanese Unexamined Patent Publication No. 5-218405 proposes a method in which an additional oxide film is formed below the nitride layer by performing a thermal treatment process in an oxygen atmosphere, whereby the nitride layer is kept away from the interface between the gate oxide film and the semiconductor substrate.

What is important in these nitriding methods is to prevent excessive nitrogen that has been introduced into a gate oxide film from reaching the interface between the gate oxide film and the semiconductor substrate. So, it can be said that in order to achieve this, important factors are realization of nitridation using activated nitrogen that is capable of introducing nitrogen into the surface of the gate oxide film, such as represented by plasma nitridation, and "re-oxidation", in which nitrogen that has reached the interface between the gate oxide film and the semiconductor substrate is detached from the interface of the gate oxide film and the semiconductor substrate.

However, when nitrogen is introduced into a gate oxide film using nitrogen activated by means of a plasma nitridation technique or the like, not all the nitrogen that has been introduced therein takes part in inter-atomic bonding; some part thereof does not take part in inter-atomic bonding and exist in interstices. This is the first time it has been found that a problem arises that such nitrogen relatively freely migrates after nitridation and easily migrates if a thermal treatment process is carried out later. Specifically, as shown in FIG. 1 for example, the nitrogen that was distributed in the vicinity of the surface of the oxide film immediately after nitridation (a) is redistributed due to the heat (about 680 to 760° C.) during the film formation of a poly-silicon gate electrode (b), which is a later process, and is caused to migrate toward the silicon substrate interface. In addition, as shown in FIG. 1, nitrogen is detected in the gate electrode, which is opposite to the silicon substrate interface. Specifically, as shown in FIG. 2, a silicon nitride film 13 is formed by introducing nitrogen after forming a silicon oxide film 12 on a silicon substrate 11. However, if a thermal treatment process is carried out later, nitrogen diffuses also toward the side of the gate electrode 15 at the same time when nitrogen diffuses into the silicon substrate interface, and it reacts with a gate electrode 15 due to the heat during that time, resulting in formation of a gate electrode 14 in which nitrogen is introduced. Since the amount of nitrogen is small in the layer relative to silicon, it does not lead to formation of an insulating film, such as a silicon nitride film that generally exists, but functions as an impurity in a conductor. Because nitrogen serves as an N-type impurity, it contributes to carrier depletion in a $p^+$ gate electrode of a p-MOS transistor, degrading p-MOS transistor's characteristics.

Moreover, this redistribution does not only occur during the above-mentioned formation of poly-silicon film, but it is also under the influence of all the thermal treatment processes that are performed as later processes. FIG. 3 shows the results of the measurement in which the amount of nitrogen in the vicinity of the interface between the gate oxide film and the semiconductor substrate was measured after each of various thermal treatment process step was carried out. Among the items shown as the names of thermal treatment process steps in FIG. 3, "IMMEDIATELY AFTER FILM DEPOSITION" indicates the state prior to the poly-silicon film deposition, and "POLYSILICON" indicates the state subsequent to the poly-silicon film deposition. "OXIDATION" indicates the state after side walls have been formed on the gate electrode composed of poly-silicon. "NITRIDE FILM DEPOSITION" and. "OXIDE FILM DEPOSITION" indicate the states after a nitride film and an oxide film have been formed, respectively, as interlayer insulating films, and "ANNEALING A" and "ANNEALING B" indicate annealing steps for densifying films after depositing the interlayer insulating films, respectively. From FIG. 3, it is understood that the amount of nitrogen increases also due to the various thermal treatment processes that are performed after the poly-silicon film deposition. In addition, some of the process steps did not show the increases, and when attention was directed to process conditions of each of the thermal treatment processes, it was found that the increases did not occur in cases where the temperature is lower than the maximum temperature of the the thermal treatment processes that had been performed before. In other words, it can be said that the final distribution of nitrogen in the gate oxide film is determined by the maximum temperature of all the thermal treatment processes, although in varying degrees. This fact suggests that even if the initial nitrogen distribution is formed ideally using activated nitrogen, there is a possibility that the distribution may be degraded by a later thermal treatment process. It also indicates that the problem arises that, because of fluctuating of nitrogen concentration which greatly affects transistor characteristics, it is difficult to control transistor characteristics.

In addition, it has been found that such nitrogen that easily moves due to thermal treatment processes also moves even at room temperature, though only slightly, and particularly the nitrogen in the vicinity of the surface disappears when placed in the ambient air until the poly-silicon deposition. It is very important to control the amount of such nitrogen because various transistor characteristics fluctuate even with a slight fluctuation of the amount of nitrogen, but practically, this is very difficult.

Meanwhile, the re-oxidization mentioned above is not universal on its own. And in case of very thin gate oxide films with a thermal nitridation using NO or the like, it is not easy to locate the nitrogen that has been introduced into the interface between the gate oxide film and the semiconductor substrate away from the interface to such an extent that its influence becomes small. As will be understood from FIG. 4, the amount of nitrogen (a) in the silicon substrate interface that is redistributed due to the thermal treatment processes subsequent to the plasma nitridation, such as a poly-silicon film deposition, is approximately 1/10 or lower of the amount of nitrogen (b) that is introduced due to NO or the like. In other words, in cases of NO or the like, it becomes necessary to locate the nitride layer sufficiently away from the silicon substrate interface by means of re-oxidization. Assuming that the thickness of the gate insulating film will become 10 Å to 15 Å in the future, the initial oxide film will be 5 Å and a stable film deposition will be impossible for mass production; therefore, this re-oxidization is not realistic. Further, it has been made clear experimentally that, at the re-oxidation temperature of 800 to 900° C. as shown in Japanese Unexamined Patent Publication No. 4-140399, it is impossible to form an oxide film layer (layer for locating the nitride layer away from the interface) at a sufficient thickness at the interface, within a nitrogen-containing oxide film in which nitrogen is introduced at a concentration that is realistically necessary (1 to 20%).

It is a primary object of the present invention to reduce diffusion of excessive nitrogen to the interface between the gate oxide film and the semiconductor substrate caused by the re-distribution of nitrogen, which has been a problem in the prior art, while adopting a nitriding method that is capable of obtaining theoretically desirable nitrogen distributions, and to suppress carrier depletion in the gate electrode and diffusion of nitrogen to the polysilicon interface, which hinders manufacture of high speed transistors, so that high-speed devices can be realized. In particular, an object is to provide a method capable of achieve the foregoing in cases where the thickness of the gate oxide film is very thin, 20 Å or less. In addition, an object is to provide a method to control the amount of nitrogen, which sensitively affects transistor characteristics, and specifically, to suppress its fluctuation due to exposure to the ambient air.

SUMMARY OF THE INVENTION

In order to accomplish the foregoing objects, the present invention provides, in accordance with a first aspect, a method of manufacturing a semiconductor device, comprising the steps of: forming an oxide film on a semiconductor substrate; introducing nitrogen into the oxide film; and thermally oxidizing the oxide film in a gas atmosphere containing oxygen; wherein the temperature during said thermally oxidizing is higher than the temperature of any other processes performed later than said thermally oxidizing.

An additional feature of the method may be that the nitrogen comprises activated nitrogen.

In addition, it is more preferable that the atmosphere in said thermally oxidizing process contains at least one of $O_2$, $O_3$, activated oxygen, oxygen radicals and oxygen ions.

It is also desirable that the partial pressure of oxygen is 0.075 to 250 Torr in said thermally oxidizing process.

The method of manufacturing a semiconductor device according to a second aspect of the present invention comprises oxy-nitriding process performing a thermal treatment process in an oxy-nitride atmosphere after said thermally oxidizing process.

Here, the oxy-nitriding atmosphere means an atmosphere that contains both a gas containing oxygen and a gas containing nitrogen.

Another additional feature of the present invention is that the atmosphere in the thermally oxidizing process is made of at least one kind of gas containing oxygen and nitrogen.

It is desirable that the gas containing oxygen and nitrogen is at least one gas of NO, $N_2O$, and $NO_2$.

A method of manufacturing a semiconductor in accordance with a third aspect of the present invention may have a feature such that at least a portion of dangling bonds on a surface of the semiconductor substrate that exists at the interface between the semiconductor substrate and the oxide film is terminated by nitrogen.

It is desirable that nitrogen is introduced in an interface between the oxide film and the semiconductor substrate at 1E11 to 7E14 atoms/cm$^2$ and more preferably at 7E12 atoms/cm$^2$.

A method of manufacturing a semiconductor device in accordance with a fourth aspect of the present invention may have a feature that the semiconductor substrate is not exposed to the ambient air during the step of introducing nitrogen and the thermally oxidizing process.

Alternatively, the feature may be such that the semiconductor substrate is not exposed to the ambient air during the step of introducing nitrogen, the thermally oxidizing process, and the oxy-nitriding process.

In accordance with a fifth aspect, the present invention provides a semiconductor device comprising: a semiconductor substrate; and an oxide film formed on the semiconductor substrate, wherein at least a portion of dangling bonds on a surface of the semiconductor substrate that exist at an interface between the semiconductor substrate and the oxide film is terminated by nitrogen.

In addition, the semiconductor device may further comprise a gate electrode formed on said oxide film; wherein the concentration of nitrogen within the interface between the gate electrode and the oxide film is higher than the concentration of nitrogen within the oxide film.

Here, it is desirable that wherein the density of the nitrogen that terminates the dangling bonds on the surface of the semiconductor substrate is 1E11 to 7E14 atoms/cm$^2$, and it is more desirable that the density is 7E12 atoms/cm$^2$.

According to this invention, it is possible to prevent nitrogen from being re-diffused and redistributed during the thermal treatment processes that are later steps, by performing a higher temperature process than all the thermal treatment processes that are later steps, in the formation of a gate insulating film. As a result, it is possible to suppress particularly the degradation of transistor characteristics due to the reaction with a polysilicon electrode. In addition, by taking advantage of the advantageous initial nitrogen distribution due to active nitrogen, it becomes possible to realize a very thin gate insulating film.

The oxidation in an oxidizing atmosphere after introducing nitrogen into an oxide film is originally expected to have the effect of detaching the nitride layer from the interface by oxidizing the interface, but at the same time, it also has the effects of terminating the interface states existing at the interface by oxygen and thus forming a good interface. Meanwhile, introducing a proper amount of nitrogen in place of oxygen brings about the effect of improving device reliability. Theoretically, the bond between silicon and nitrogen is stronger than the bond between silicon and oxygen, and therefore, the bond is unlikely to break during transistor operations, or against other physical or electrical stresses.

Moreover, a sufficient oxidation is performed by an thermally oxidizing process and thereafter nitrogen substantially equivalent to the amount of interface states existing in the semiconductor substrate interface is introduced. This makes it possible to keep the adverse effects due to excessive nitrogen away from the silicon substrate interface and to stabilize the interface states by forming a proper amount of bonds between silicon and nitrogen, which is stronger than bonds between silicon and oxygen.

Additionally, because at least a portion of dangling bonds on the semiconductor substrate surface existing at the interface between the semiconductor substrate and the oxide film is terminated by nitrogen, the advantageous effect is achieved that transistor characteristics are improved. Here, the nitrogen equivalent to the dangling bonds on the semiconductor substrate surface, that is, the proper density of nitrogen per unit area that is to be introduced into the interface for bonding with silicon is preferably 1E11 to 7E14 atoms/cm$^2$. The interface states may be considered as dangling bonds of silicon that exist at the silicon substrate interface. The amount of interface states that are exposed greatly fluctuates depending on the history that is immediately before the gate insulating film is formed. For example, a physically rough silicon substrate interface creates a very large amount of interface states. Also, it has been empirically known that even if a very smooth interface is formed, there exist interface states of 1E11 atoms/cm$^2$. Meanwhile, the density of bonds (dangling bonds) existing on the surface of a silicon substrate having a (100) plane orientation ordinarily used is about 7E14 atoms/cm$^2$. This is the reason for setting the above-described range, although the proper amount of nitrogen is greatly dependent on the condition of the silicon substrate beforehand.

Furthermore, the thermal treatment process in an oxidizing atmosphere in the thermal treatment process step has an additional effect of suppressing the fluctuation (decrease) of nitrogen at room temperature after the nitridation in which nitrogen has been introduced into the oxide film. In other words, what is important is what kind of atmosphere is used for controlling prior to the oxidizing atmosphere after the nitridation using active nitrogen.

The semiconductor substrate is not exposed to the ambient air or a clean room atmosphere during the step of introducing nitrogen in a nitriding atmosphere and during the step of thermally processing the nitrogen-containing oxide film in an oxidizing atmosphere for the thermal treatment process step, and each of the steps are carried out in the same process chamber or in different process chambers via a transport chamber that is isolated from the ambient air, whereby an advantageous effect is achieved that the fluctuation of the amount of nitrogen that may be caused when exposed to the ambient air can be controlled, and a process with good reproducibility can be configured.

In a semiconductor device having a semiconductor substrate and an oxide film formed on the semiconductor substrate, at least a portion of dangling bonds on a semiconductor substrate surface existing at the interface between the semiconductor substrate and the oxide film are terminated by nitrogen, whereby an advantageous effect is achieved that transistor characteristics can be improved. In addition, a gate electrode is further provided on the oxide film and the concentration of nitrogen within the interface between the gate electrode and the oxide film is made higher than the concentration of nitrogen within the oxide film, whereby an advantageous effect is achieved that boron diffusion from the gate electrode to the semiconductor substrate can be suppressed.

BRIEF DESCRIPTION OF THE DRAWING

The above and other objects, advantages and features of the present invention will be more apparent from the following description taken in conjunction with the accompanying drawings in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 5:
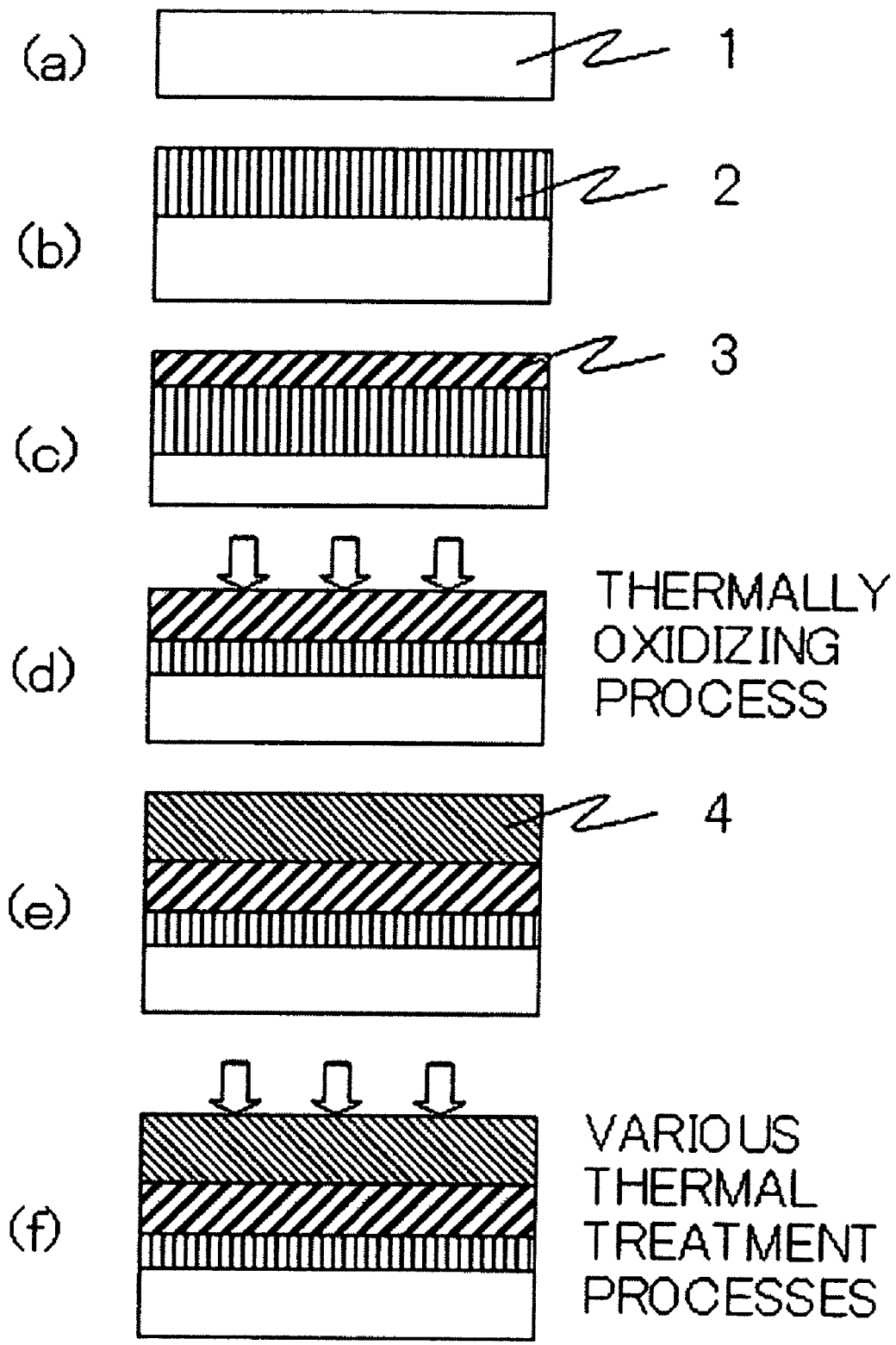
FIG. 5(*a*)–(*f*) is a process flow chart for illustrating a method of manufacturing a semiconductor device, according to a first embodiment of the present invention.

(Embodiment 1) FIG. 5 explains the method of manufacturing a semiconductor device in accordance with a first embodiment of the present invention along the order of the process flow. It should be noted that although the present invention is in reality used as part of the manufacturing steps for fabricating various devices typically represented by transistors, not the entire flow for fabricating devices is depicted herein, but only the portions that represent contents, objectives, advantageous effects, and features of the present invention which are extracted therefrom.

First, a silicon substrate 1 on which a gate insulating film is to be formed is put in a clean condition using a suitable cleaning solution (FIG. 5(a)). Next, a thermal treatment process is carried out in an oxidizing atmosphere to form a silicon oxide film 2, serving as a first oxide film, on the silicon substrate 1 (FIG. 5(b)). Then, a process is carried out in a nitriding atmosphere to introduce nitrogen into the silicon oxide film 2 (FIG. 5(c)). During this time, if active nitrogen is formed within the process chamber or externally and used as nitridation seed, a silicon nitride layer 3 can be formed in the surface side of the silicon oxide film 2, as shown in FIG. 5(c). Next, a thermal treatment process (thermally oxidizing process) is carried out again in an oxidizing atmosphere (FIG. 5(d)). What is important during this time is that the process must be carried out with a process condition (temperature) in which $T1 \leqq T2$, where the maximum temperature of all the later-described thermal treatment process steps is T1 and the temperature of this thermal treatment process is T2. With this thermal treatment process, the distribution of the silicon nitride layer 3 widens as shown in FIG. 5(d). After the manufacturing steps described above have finished, an electrode 4, serving as a gate electrode, is formed (FIG. 5(e)). Subsequent to this, various manufacturing steps are carried out for fabricating a device. Applicable steps includes a step of forming a gate electrode structure, a step of introducing various impurities and activating them, a step of forming an insulating film for isolating various elements, a step of selectively removing or leaving these materials, and the like. When only thermal treatment processes are extracted among them and the representative steps are denoted, for example, by A to D (FIG. 5(f)) and the respective process temperatures are denoted by Ta, Tb, Tc, and Td, the maximum temperature among them is the foregoing T1, which is represented by T1=MAX{Ta, Tb, Tc, Td}. Here, MAX{Ta, Tb, Tc, Td} is the function for extracting the maximum value from Ta, Tb, Tc, and Td.

Figure 6:
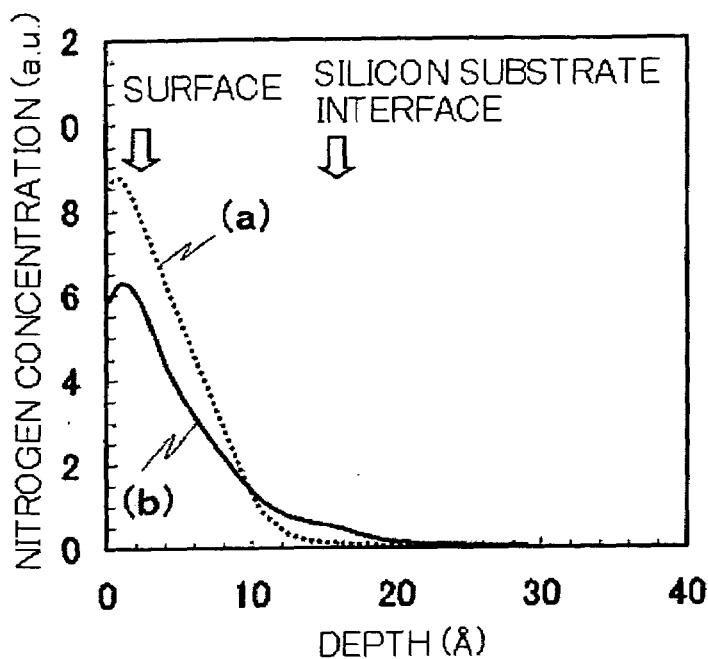
FIG. 6 is a graph showing a nitrogen distribution in an insulating film, for illustrating an effect of the first embodiment of the present invention.

Further, each of the manufacturing steps in the above-described process flow is described in detail. The cleaning technique indicated in FIG. 5(a) is implemented using a water solution of hydrogen peroxide containing ammonia, a water solution of hydrogen peroxide containing sulfuric acid, a water solution of hydrogen peroxide containing hydrochloric acid, a diluted water solution of fluoric acid, either alone or in combination. Next, for the formation of the silicon oxide film indicated in FIG. 5(b), a thermal treatment process is performed, for example, in a dry atmosphere in which oxygen is diluted with nitrogen in a temperature range of 800 to 1000° C. and in a pressure range of 1 Torr to normal pressure so that a desired film thickness is realized. For this step, a single-wafer type rapid thermal treatment process (RTP) apparatus is used as the film deposition apparatus. Next, as a possible method of introducing of nitrogen indicated in FIG. 5(c), for example, a plasma is generated by introducing microwave or by a RF technique in nitrogen or in an atmosphere in which nitrogen and a rare gas for diluting such as helium, argon, and krypton are introduced so that nitrogen is introduced by turning it into active nitrogen radicals or nitrogen ions. The amount of nitrogen can be controlled by a substrate temperature as well as the power and duration for generating plasma, and for example, about 7% nitrogen can be introduced with the conditions of 400° C., 1500 W, and 15 seconds. The line (a) in FIG. 6 shows a nitrogen profile in the case where nitrogen is introduced into a silicon oxide film having a thickness of 15 Å under the above-described conditions. It can be seen that nitrogen is segregated on the surface in a large amount, and that the nitrogen amount becomes less toward the silicon substrate interface. For example, at a point 10 Å inside from the surface, the amount of nitrogen is about ⅕ of that of the surface. This phenomenon of nitridation is basically based on the fact that the existing bonds between silicon and oxygen are broken and bonds between nitrogen and silicon are newly formed. However, there exist many states in which nitrogen atoms do not bond with silicon but exist in interstices, or in which broken bonds remain.

The subsequent thermal treatment process (thermally oxidizing process) in an oxidizing atmosphere indicated in FIG. 5(d) utilizes the conditions of, for example, a temperature of 1000 to 1080° C., gas flow rates of 0.1 to 10 slm for oxygen and 0.1 to 10 slm for nitrogen, a pressure of 0.5 to 25 Torr, and a duration of 2 to 30 seconds. The line (b) in FIG. 6 shows an example of nitrogen profile after the thermally oxidizing process with the foregoing range has been implemented from the state represented by the line (a) in FIG. 6. It is understood that the amount of nitrogen on the surface is ⅔ of that immediately after the nitridation, but the amount of nitrogen at the point 10 Å inside the surface is almost the same, and conversely, the amount of nitrogen in the vicinity of the interface between the gate oxide film and the semiconductor substrate is greater than that immediately after the nitridation represented by the line (a) in FIG. 6. This occurs because the unbonded nitrogen that exists immediately after the nitridation disappears (in the surface side) or diffuses deeply due to the present thermal treatment process step, as described above. Thus, although diffusion to the vicinity of the interface is also observed in the present process, its absolute amount is greatly improved in comparison with cases where the present invention is not adopted, as will be described later. Furthermore, the conditions of the present thermal treatment process have a great significance in terms of realizing a desired film thickness and maintaining a profile, as will be described later.

A method for the subsequent film deposition of a gate electrode material indicated in FIG. 5(e) may include, for example, a deposition of polysilicon film. This is usually implemented within a temperature range of 680 to 760° C.

Further, typical thermal treatment processes after the polysilicon film deposition are considered (FIG. 5(f)). Various thermal treatment processes can be listed, and among them are: A) a process in which an oxide film is formed on the side face portions of a gate oxide film and a gate electrode; B) a process in which impurities are introduced into a gate electrode or a silicon substrate, and the impurities are activated; C) a deposition of an interlayer insulating film;

and D) a process for densifying various insulating films that have been deposited. Generally, the thermal treatment process denoted by B above, which is for activating impurities such as phosphorus and boron introduced into a source, a drain, or a gate electrode, is the highest in temperature. For example, the thermal treatment process is carried out at 1050° C. for 0 to 10 seconds in this case. The duration "0 second" herein means that the temperature is increased to a predetermined temperature (1050° C.), and once the temperature is reached, a temperature decreasing step is entered immediately without holding the temperature. What is important here is that the temperature used for activating impurities must never be higher than that in the thermally oxidizing process in FIG. 5(d). In other words, it is very important in the present invention that the temperature in FIG. 5(d) is set to be T2 (T1≦T2) when the condition in FIG. 5(f) is determined to be T1 from various factors.

Figure 1:
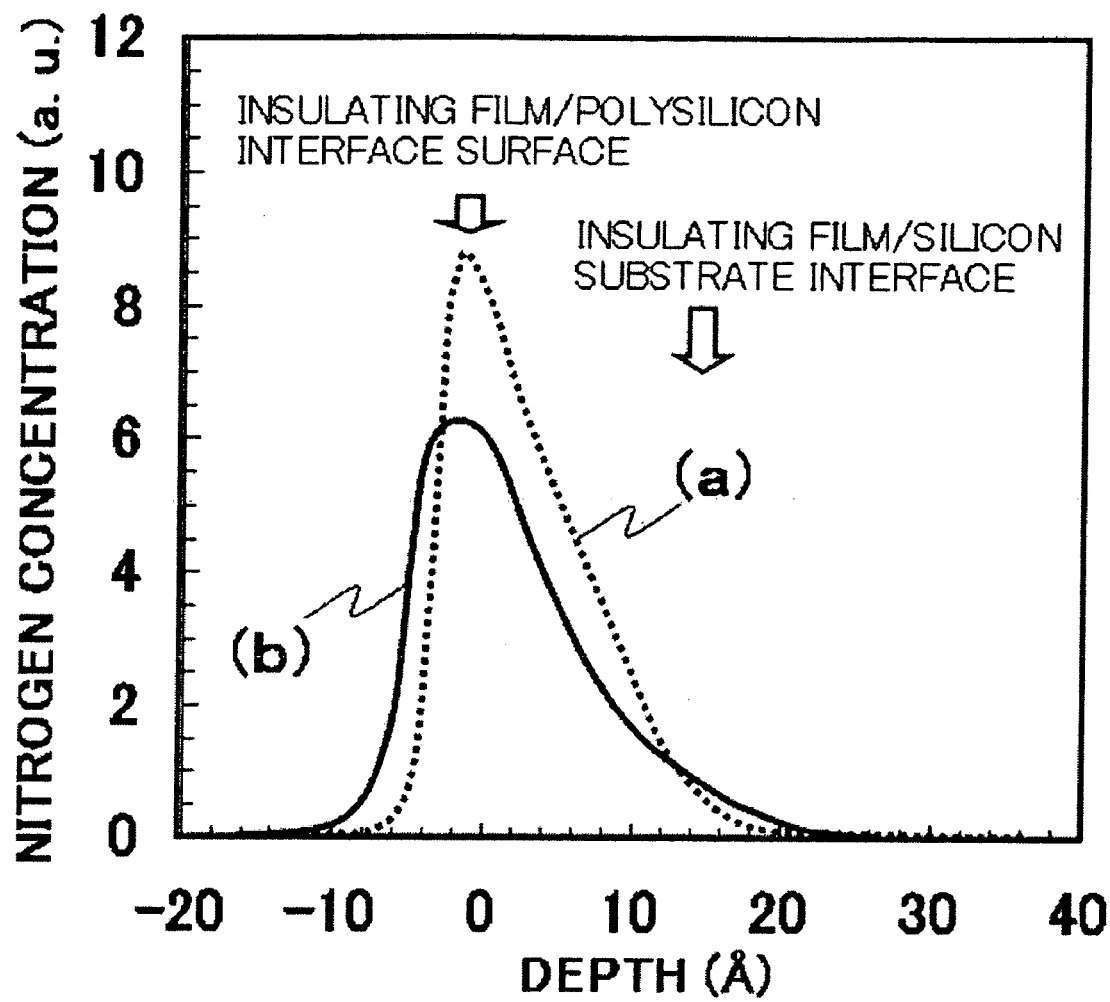
FIG. 1 is a graph showing the behavior of nitrogen in an insulating film, illustrating a conventional example.
Figure 2:
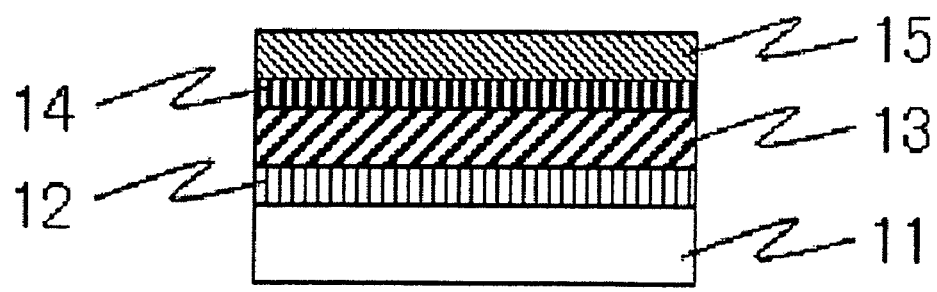
FIG. 2 is a view showing a state of a structure including a poly-silicon electrode, for illustrating the conventional example.
Figure 3:
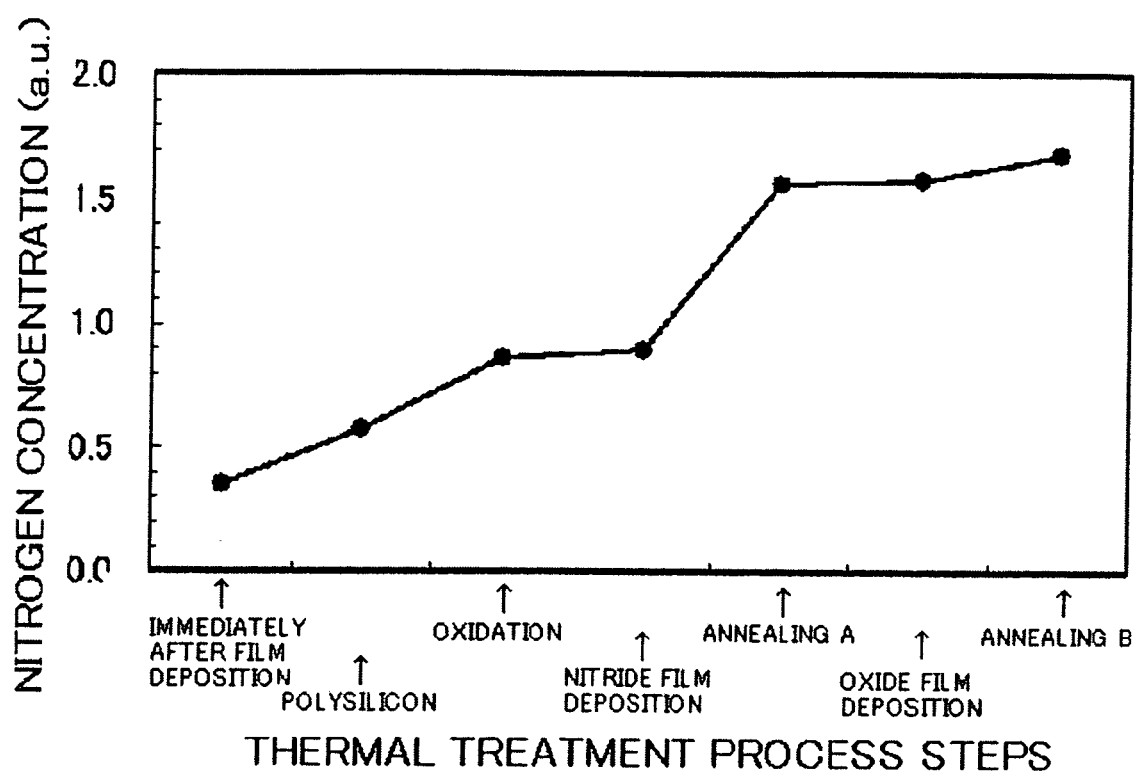
FIG. 3 is a graph capturing a change in the amount of nitrogen at a silicon substrate interface after various thermal treatment process steps, for illustrating the conventional example.
Figure 4:
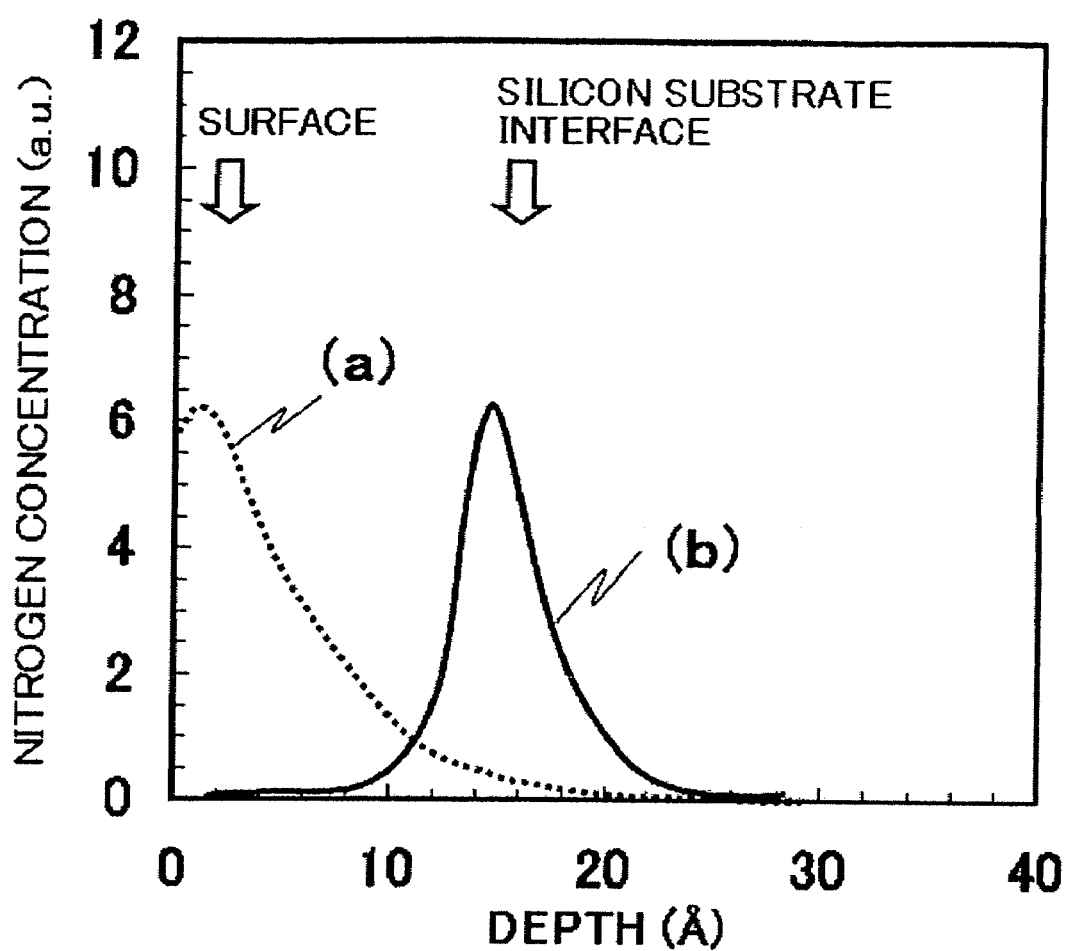
FIG. 4 is a graph for illustrating a nitrogen distribution due to nitridation caused by a NO gas, which is a conventional example.
Figure 7:
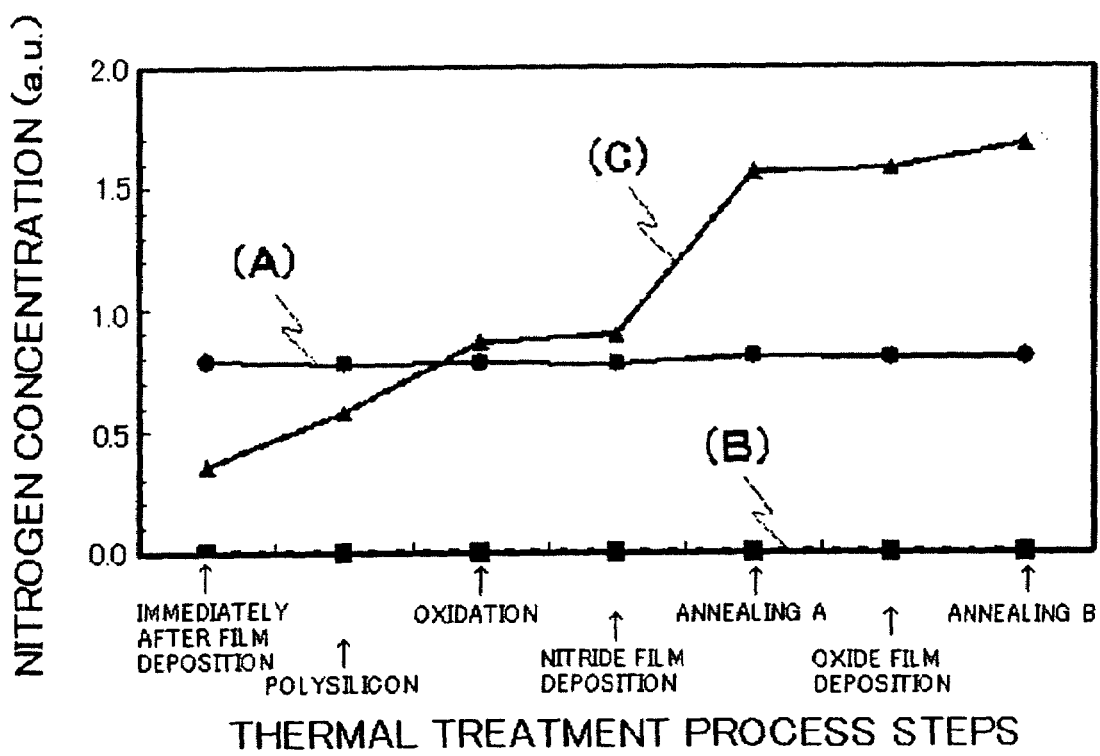
FIG. 7 is a graph capturing a change in the amount of nitrogen in each of portions in an insulating film after various thermal treatment process steps, for illustrating an effect of the first embodiment of the present invention.

FIG. 7 shows the results of analysis when the present invention is implemented, in which (A) the amount of nitrogen in the vicinity of the interface between gate oxide film and the semiconductor substrate and (B) the amount of nitrogen within the polysilicon electrode in the vicinity of the interface between the polysilicon electrode and the gate oxide film are analyzed immediately after each of the thermal treatment processes is performed and passed. This figure also shows the results of the amount of nitrogen in the vicinity of the interface between the gate oxide film and the semiconductor substrate in the conventional example of FIG. 3(C). Among the items shown as the names of thermal treatment process steps in FIG. 7, "IMMEDIATELY AFTER FILM DEPOSITION" indicates the state prior to the polysilicon film deposition, and "POLYSILICON" indicates the state subsequent to the polysilicon film deposition. "OXIDATION" indicates the state after side walls have been formed on the gate electrode composed of polysilicon. "NITRIDE FILM DEPOSITION" and "OXIDE FILM DEPOSITION" indicate the states after a nitride film and a oxide film have been formed, respectively, as interlayer insulating films, and "ANNEALING A" and "ANNEALING B" indicate annealing steps for densifying the films after depositing the interlayer insulating films, respectively.

From the line (A), it is understood that variation is remarkably suppressed in comparison with the result of the conventional example (C), in which a thermally oxidizing process is not performed as one step of the insulating film formation steps. Of course, the diffusion of nitrogen into the interface is temporarily promoted due to the thermally oxidizing process, as described above (FIG. 6), but the amount of nitrogen in the interface when the device is ultimately finished is clearly smaller in the case of the present invention. This means that when the same thermal treatment process as a whole is carried out, excessive nitrogen is more unlikely to be eliminated and is rather likely to move to the interface in the case where an upper portion of the insulating film is capped by a polysilicon film or the like, and it can be said that the advantageous effects of the present invention are exhibited particularly in cases where a thermal treatment process is performed without forming a cap layer on the surface. In addition, what is more remarkable is the concentration of nitrogen within a polysilicon electrode (B), and it is understood that in the present invention, it was reduced to the detection limit of the analysis. This seems to be due to the fact that, by performing a re-oxidation process at the maximum temperature while forming an insulating film according to the present invention, it has been made possible to redistribute and eliminate unstable excessive nitrogen in advance, and to suppress re-migration and re-distribution during later process steps.

Figure 8:
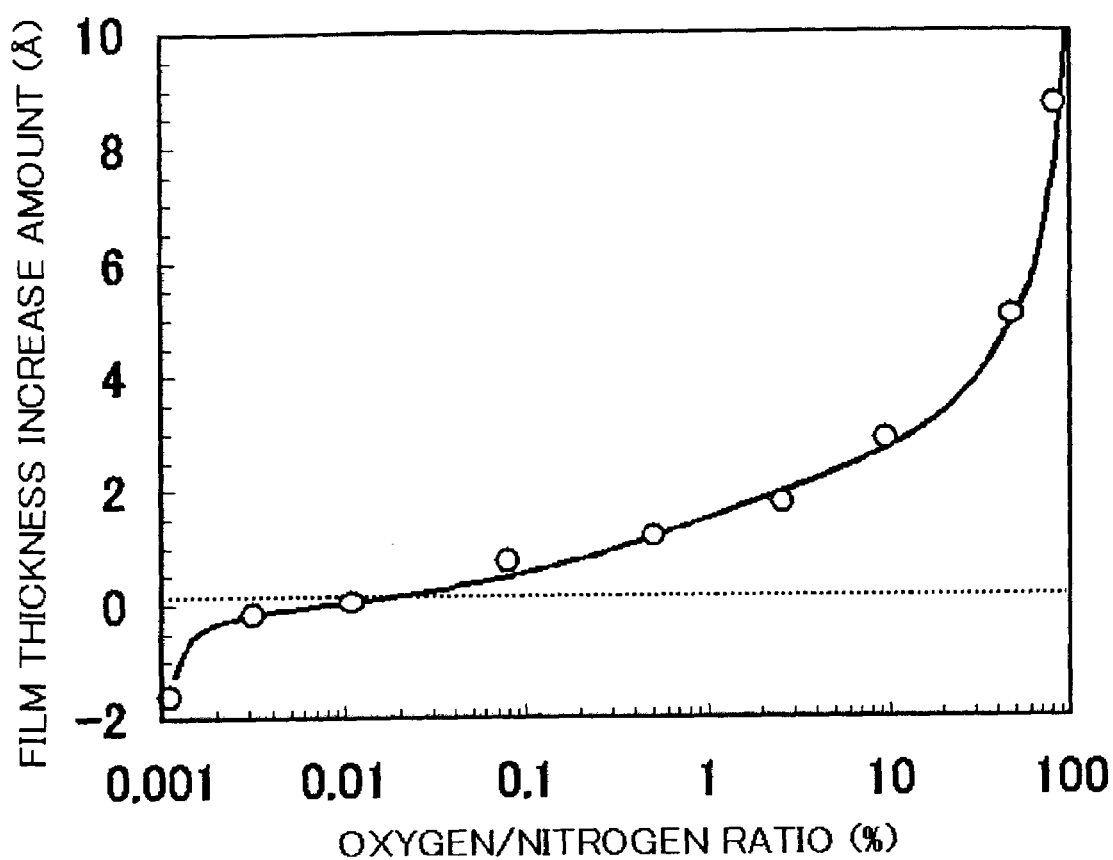
FIG. 8 is a graph showing how a film thickness increases in a second thermally oxidizing process, for illustrating the first embodiment of the present invention.

In addition, the atmosphere during the thermally oxidizing process in FIG. 5(d) is also important, and it is one of the features of the present invention. Specifically, an increase in film thickness due to the thermal treatment process in an atmosphere containing oxygen needs to be suppressed as small as possible, and for that reason, it is necessary to restrict the content of oxygen. FIG. 8 shows a state of increase in film thickness during the thermally oxidizing process, which shows its dependency on the oxygen/nitrogen ratio in cases where a gas flow rate is controlled and varied for the atmosphere. Here, assuming a case in which the final film thickness of the gate oxide film is 20 Å or less, the initial oxide film thickness (FIG. 5(b)) is about 15 Å, and an increase of about 5 Å is permissible. Accordingly, the oxygen/nitrogen flow rate ratio is required to be about 50% or less in this case. It is of course possible that the oxide film thickness is made as thin as, for example, 10 Å, and in that case, a film thickness increase due to the re-oxidation is further permissible; but in reality, it is undesirable in terms of transistor characteristics because the amount of nitrogen reaching the silicon substrate/insulating film interface due to a nitridation process, which is a subsequent step, increases in proportion to the decrease in the thickness of the oxide film, which is the underlayer. On the other hand, it is seen from FIG. 8 that if the flow rate ratio is lower than 0.015%, the amount of film thickness increase becomes 0 or less. This indicates that the film thickness of the insulating film immediately after the nitridation is reduced, which means that the oxide film is partially peeled off in micro regions. Generally, silicon and oxygen occasionally sublimate because of a thermal treatment process, and when oxygen becomes less than a certain amount, they are eliminated from the inside of the insulating film (surface) in the form of Si—O bonds. When the elimination occurs and proceeds, the insulation performance of the oxide film degrades. It is considered that this phenomenon occurs in the range at or below 0.015% in FIG. 8, and it is very important to realize the atmospheric composition above that range.

Further, this series of phenomena will be more readily understood if expressed in the form of partial pressure of oxygen. Here, the partial pressure of oxygen means a pressure in the case where it is assumed that a gas containing oxygen fills up an entire apparatus. The thermally oxidizing process affects not only the oxygen gas ratio but also the pressure. When the total pressure is set low, the oxygen partial pressure inevitably becomes low, and accordingly, the flow rate of oxygen gas needs to be set high. As a result of various experiments including the above-described conditions, it was discovered that it is important to make the oxygen partial pressure from 0.075 to 250 Torr to suppress film thickness increases and prevent sublimation. Compliance with this is important in the present invention.

(Embodiment 2) Next, a manufacturing method of a semiconductor device is explained as a second embodiment of the present invention. In the first embodiment, oxygen gas was primarily used as an oxidizing atmosphere for the thermally oxidizing process step. Here, the thermal treatment process in FIG. 5(d) is performed by forming an atmosphere by a gas containing nitrogen as well as oxygen, such as NO gas, $N_2O$ gas, and $NO_2$ gas. For example, the process is performed with the conditions of 2 slm of NO gas and 10 slm of $N_2$ gas, 800° C., 2 Torr, and 5 seconds. At this time, as a result of measurement using an analysis technique called SIMS (Secondary Ion Mass Spectroscopy), it was found that nitrogen was introduced at 7E12 atoms/cm² in the interface between the gate oxide film and the semiconductor substrate; Also, although a NO gas is inferior to oxygen in the form of a simple substance in terms of oxidation performance, it has a capability of oxidizing the silicon substrate interface slightly. A measurement with an ellipsometry measurement device revealed that an increase in film thickness of 0.7 Å occurred due to this process. What is important is to control the amount of nitrogen introduced in the interface by this process, and it is also necessary to restrict the amount of nitrogen to such a degree that it terminates the interface states but does not become excessive. The reason is that excessive nitrogen easily redistribute and moreover is likely to cause deformation in the insulating film. The deformation considerably degrades interface characteristics, that is, transistor characteristics. Moreover, the amount of interface states that has been exposed varies depending on the conditions of the nitridation process performed immediately before the present thermal treatment process, and therefore, it is necessary to keep track of the amount accurately to select the conditions for a NO thermal treatment process or the like. The temperature is 800° C. in the above-described example, and in this case, it is necessarily required that the maximum temperature T1 for all the later thermal treatment process steps for realizing transistors should be 800° C. or lower. In other words, when such a condition is possible, the thermally oxidizing process can be performed at 800° C.

Figure 9:
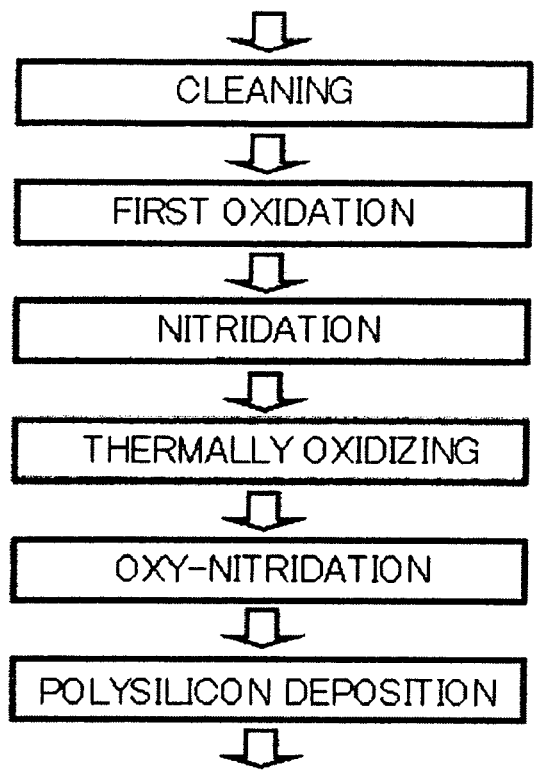
FIG. 9 depicts a process flow for illustrating a third embodiment of the present invention.
Figure 10:
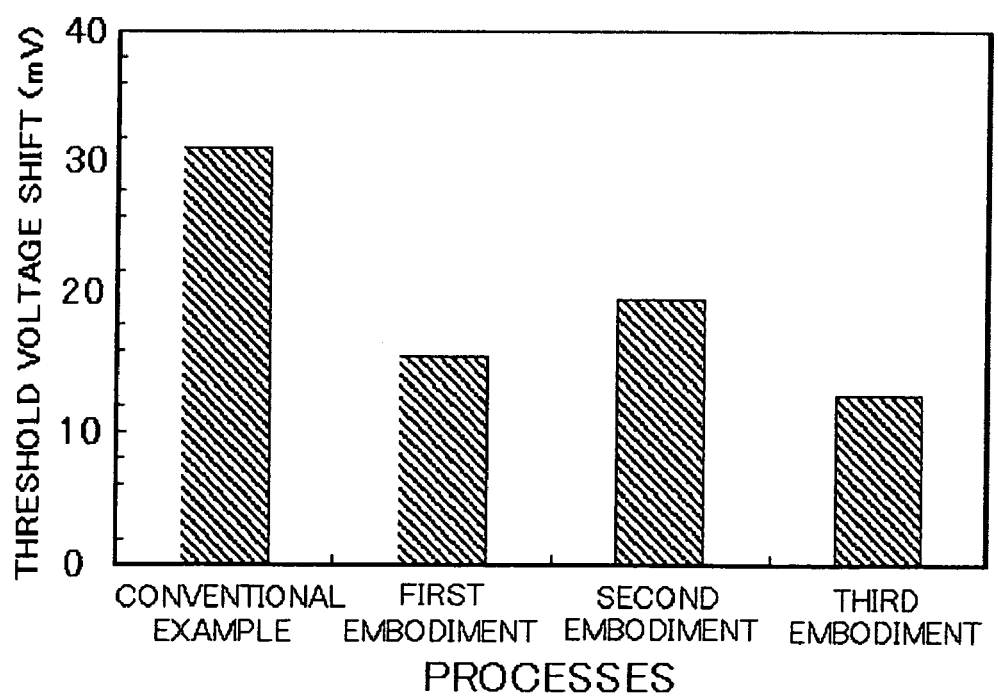
FIG. 10 shows results of NBTI, which is a reliability test for transistors, for illustrating an effect of the third embodiment of the present invention.

(Embodiment 3) Next, a third embodiment is described. This is a combination of the first embodiment and the second embodiment, in which the restriction of elevated temperature in the second embodiment is solved. Specifically, after the nitridation process and the thermally oxidizing process of the first embodiment are carried out, an oxynitridation process using NO gas or the like is once again carried out to introduce to the interface an equivalent amount of nitrogen to the amount of interface states that have been exposed (FIG. 9). Here, the oxidation for forming an oxide film is denoted by "FIRST OXIDATION", and the thermally oxidizing process after nitrogen has been introduced is denoted by "THERMALLY OXIDIZING". In cases where the above-described two embodiments are combined, the final film thickness becomes about 0.7 Å (film thickness measured with ellipsometry) thicker than the target thickness, and therefore, it is necessary to reduce the first thermal treatment process in an oxidizing atmosphere, corresponding to that film thickness of 0.7 Å. This can be achieved by, for example, slightly reducing the pressure to 2 Torr while maintaining the temperature at 1050° C. An advantage of this method is that both stabilizing of nitrogen by means of a high-temperature thermal treatment process and introducing of a proper amount of nitrogen into the interface are possible. After the high temperatures process, for example, nitrogen is introduced into a Si interface at 7E12 atoms/cm$^2$ using NO gas. This value is an optimized value obtained through experiments, and it is substantially equivalent to the amount of interface states that existed before the process of the present invention. FIG. 10 shows the result of evaluating reliability referred to as NBTI (Negative Bias Temperature Instability). This reliability evaluation measures the shift amount of the threshold voltage of a transistor after an electrical stress is applied, and it is judged that the smaller the shift amount is, the better the transistor is. Then, it is generally known that the less the nitrogen is and the less the amount of interface states is in the vicinity of the interface between the gate oxide film and the semiconductor substrate, the smaller the amount of variation thereof is and the better the transistor is. When the first to third embodiments and a conventional example are compared, it is clearly seen from the figure that the result was, in the descending order of the amount of variation; the third embodiment<the first embodiment<the second embodiment<the conventional example. This is the first time it has been found that even if there is nitrogen in the vicinity of the interface, transistor characteristics can be good insofar as the amount of nitrogen is substantially equivalent to that of the interface states. The reason why the second embodiment did not show a better result than the first embodiment is that it was not possible to completely prevent the redistribution of excessive nitrogen and interstitial nitrogen that have been introduced during the prior nitridation step by the 800° C. NO process alone because the maximum thermal treatment process temperature of all the thermal treatment process steps was 1050° C. (same as FIG. 5).

Figure 11:
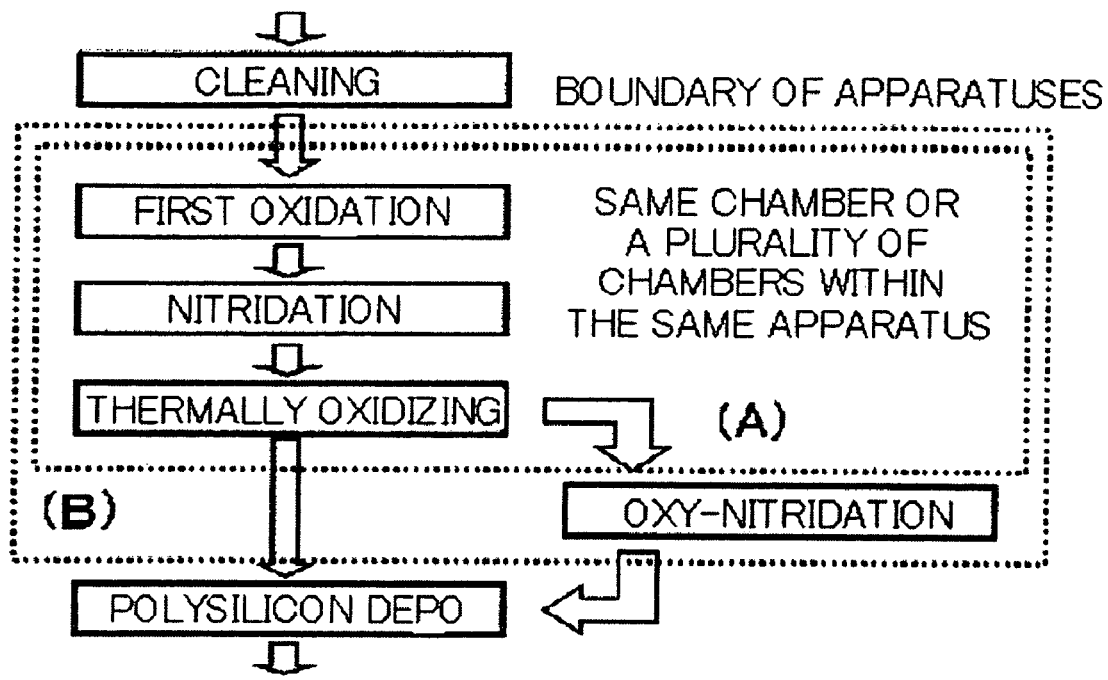
FIG. 11 is a flowchart showing various processes from a viewpoint of equipment, for illustrating a fourth embodiment of the present invention.
Figure 12:
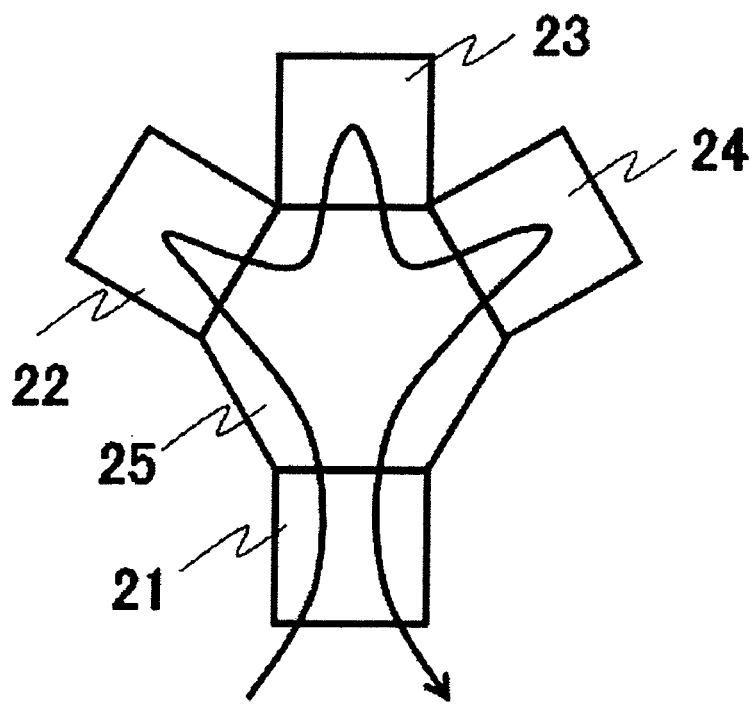
FIG. 12 is a view showing an actual flow of a silicon semiconductor substrate in process equipment, for illustrating the fourth embodiment of the present invention.
Figure 13:
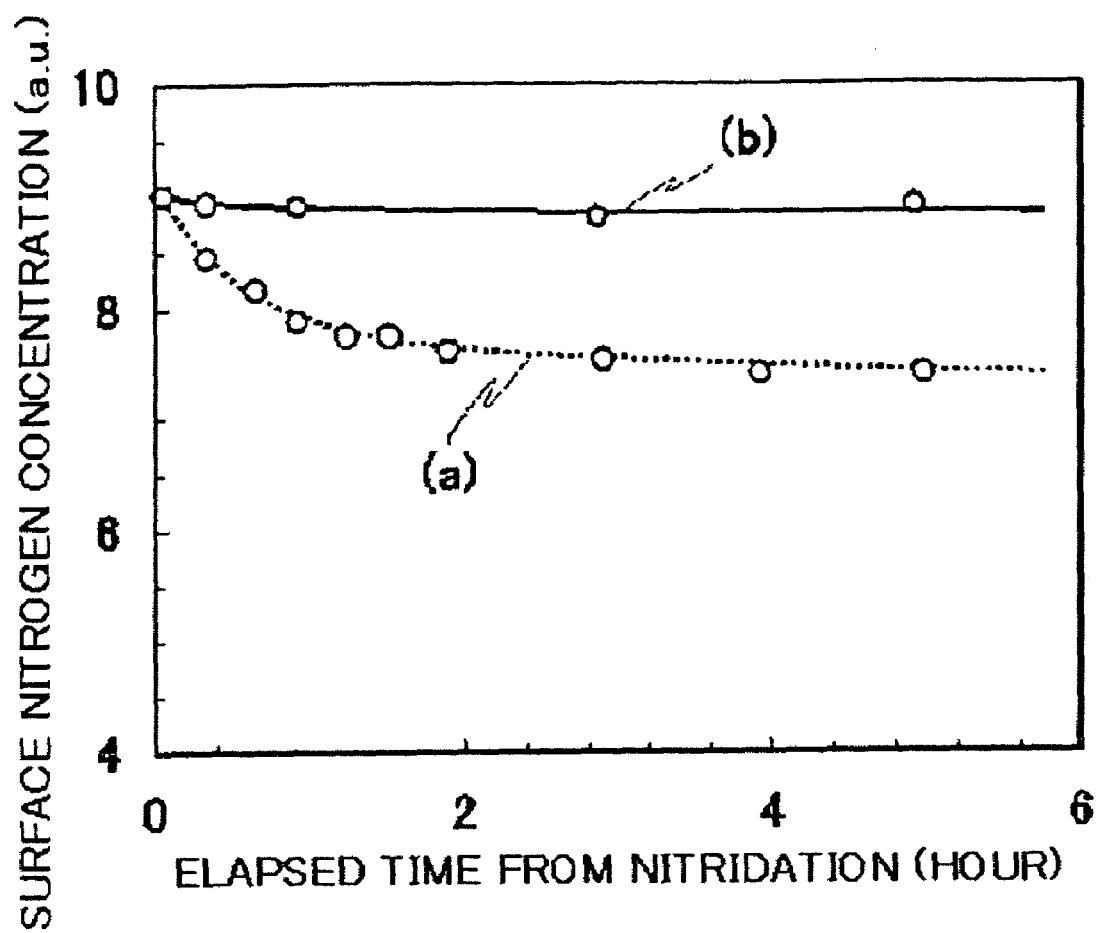
FIG. 13 is a graph showing a change in the amount of nitrogen on an insulating film surface, for illustrating the effects of the fourth embodiment of the present invention.

Further, one embodiment of the present invention is described with reference to FIG. 11. FIG. 11 is a flowchart representing a fourth embodiment of the present invention, which shows that the processes (A) enclosed by the inner dotted line represent an implementing method of the first and second embodiments while the processes (B) enclosed by the outer dotted line represent an implementing method of the third embodiment. Here, the oxidation for forming an oxide film is denoted by "FIRST OXIDATION", and the thermally oxidizing process after nitrogen has been introduced is denoted by "THERMALLY OXIDIZING". As seen from the flowchart, these steps are carried out in the same chamber, or substrate transfer is performed alternately through a transport chamber that is isolated from the ambient air so that each of the steps advances without exposing the semiconductor substrate to the ambient air. FIG. 12 represents an example in which processes are configured combining single wafer-type thermal treatment process apparatuses for realizing the flow (A) of FIG. 11, showing the flow of a silicon substrate. Here, a case is shown in which formation of an oxide film, a subsequent nitridation process, and a further subsequent second thermally oxidizing process are achieved in separate chambers. As shown in FIG. 12, first, a substrate is introduced into a load lock chamber 21, and after producing a a vacuum in the load lock chamber 21, an oxide film is formed on the substrate in an oxidation chamber 22. Next, after the substrate is transferred through a transport chamber 25, nitrogen is introduced into the oxide film in a plasma nitridation chamber 23. Thereafter, after the substrate is transferred through the transport chamber 25, a thermally oxidizing process is carried out in a thermally oxidizing process chamber 24. In order to illustrate the effect of the invention, FIG. 13 shows a comparison between the measurement result of the amount of nitrogen immediately before the second thermally oxidizing process and that of the conventional example. The amount of variation over time is smaller when the present invention is adopted (b) than when the silicon substrate is exposed to the ambient air between the nitridation process and the second thermally oxidizing process (a). Although the cause is not clear, it is considered that when the substrate was exposed to the ambient air, such a phenomenon occurred that unstable nitrogen immediately after the nitridation is eliminated or migrated due to the environment in the ambient air, whereas by controlling the atmosphere, the variation was suppressed. Since controlling the migration of instable nitrogen is important in controlling transistor characteristics, it is understood that the present invention is very important.

Preferred embodiments of the present invention have been described thus far, but the invention is not limited to the conditions and examples described in the foregoing embodiments. For example, although a dry oxidation was shown as an example of the step of forming an oxide film, the advantageous effects of the present invention will not be reduced by adopting any processes that are capable of forming an oxide film having a film thickness of about 10 to 20 Å. For example, it is also possible to employ an atmosphere in which oxygen and hydrogen are mixed (generally referred to as a wet oxidation), and the invention may be achieved by using a batch-type thermal treatment process apparatus, which is called a diffusion furnace, as the film deposition apparatus, in place of the above-described RTP.

In addition, it has been described that plasma is used for generating active nitrogen along with the conditions, such as power; however, the parameters such as power are inherent to the apparatus, and the feature of the present invention does not lie in that point. The advantageous effects of the present invention do not disappear insofar as it is such a process in which nitrogen is introduced and its distribution immediately after the introduction is controlled to be a good distribution in the vicinity of the surface. For example, what is important in the method of introducing nitrogen in the vicinity of the surface is to generate active nitrogen, and for the method of generating the active nitrogen, light may be used other than plasma. Specifically, the present invention can be realized by bringing nitrogen molecules into an active state by irradiating them with light having a sufficiently short wavelength ($\lambda$<400 nm) and a high energy.

Regarding the subsequent thermally oxidizing process step as well, the technique for oxidizing the interface at a proper amount is important, as was described above. Accordingly, it is necessary to blend at least one kind of gases containing oxygen atoms, and the possible candidates includes ozone ($O_3$), active oxygen, oxygen radicals, and oxygen ions, in addition to oxygen molecules. It is of course necessary to sufficiently study the process conditions when using the respective atmospheres, but it is necessary that they are within the specified range of oxygen partial pressure as set forth above.

Moreover, although an example using NO gas was described herein for the oxynitridation process step, it is also possible to use $N_2O$ and $NO_2$, in which oxygen and nitrogen are blended, as is described above. What is important is to introduce a proper amount of nitrogen into the silicon substrate interface.

Furthermore, the embodiments consistently described examples using a silicon substrate as the semiconductor substrate, but the advantageous effects of the present invention are not reduced even if germanium, SiC, polysilicon, or the like are employed as other substrates. In addition, although an oxide film was shown as an example of the gate oxide film, it is a matter of course that the invention is applicable to other semiconductor devices in which their characteristics can be improved by reducing the interface states.

Additionally, regarding FIG. 12, which illustrated the processes carried out without exposing the substrate to the ambient air, the advantageous effects of the present invention are not lost and similar effects are achieved even if, for example, the oxide film deposition and the thermally oxidizing process are performed within the same chamber but only the nitridation is carried out in a separate chamber, insofar as the combination falls within the present invention, in which the substrate is not exposed to the ambient air, as can be inferred from the fact that the wafer flow shown in the figure is not the only choice but the processes can be implemented within the same chamber.

Thus, in accordance with the present invention, a thermal treatment process is performed after the nitridation process for introducing nitrogen into an oxide film under such a condition that the temperature is higher than the temperatures in all the thermal treatment processes that are performed later, in such a selected oxidizing atmosphere that a film thickness and sublimation can be suppressed, in order to redistribute/eliminate excessive or intersititial nitrogen and form a state that will not change during the later thermal treatment processes. This makes it possible to suppress further nitridation of a silicon substrate and nitridation of a polysilicon electrode. As a result, the performance of the transistor comprising the gate insulating film and electrode structure thus obtained does not degrade, or rather, it is possible to improve the performance. Further, improvement in reliability can also be expected. In addition, reproducibility and mass-productivity can be improved by controlling the amount of nitrogen completely.

Furthermore, the dangling bonds existing at the interface are terminated by nitrogen, which has a greater bonding strength to dangling bonds of silicon than oxygen, and thereby a semiconductor element having more stable characteristics can be formed in comparison with the case in which they are terminated by oxygen.

It is apparent that the present invention is not limited to the above embodiments, but may be modified and changed without departing from the scope of the invention.

What is claimed is:

1. A method of manufacturing a semiconductor device, comprising the steps of:
   forming an oxide film on a semiconductor substrate;
   introducing nitrogen into the oxide film; and
   thermally oxidizing the oxide film in a gas atmosphere containing oxygen;
   wherein the temperature during said thermally oxidizing is higher than the temperature of any other processes performed later in the manufacture of the semiconductor device than the thermally oxidizing step.

2. The method of manufacturing a semiconductor device according to claim 1,
   wherein the nitrogen comprises activated nitrogen.

3. The method of manufacturing a semiconductor device according to claim 1,
   wherein the atmosphere in said thermally oxidizing process contains at least one of $O_2$, $O_3$, activated oxygen, oxygen radicals and oxygen ions.

4. The method of manufacturing a semiconductor device according to claim 1,
   wherein the partial pressure of oxygen is 0.075 to 250 Torr in said thermally oxidizing process.

5. The method of manufacturing a semiconductor device according to claim 1, further comprising oxy-nitriding process performing a thermal treatment process in an atmosphere contains at least oxygen and nitrogen after said thermally oxidizing process.

6. The method of manufacturing a semiconductor device according to claim 5,
   wherein the thermally oxidizing process is performed in an atmosphere containing at least oxygen and nitrogen.

7. The method of manufacturing a semiconductor device according to claim 6,
   wherein the gas containing oxygen and nitrogen is at least one gas of NO, $N_2O$, and $NO_2$.

8. The method of manufacturing a semiconductor device according to claim 5, wherein the semiconductor substrate is not exposed to the ambient air during the step of introducing nitrogen, the thermally oxidizing process, and the oxy-nitriding process.

9. The method of manufacturing a semiconductor device according to claim 1,
wherein at least a portion of dangling bonds on a surface of the semiconductor substrate that exists at the interface between the semiconductor substrate and the oxide film is terminated by nitrogen.

10. The method of manufacturing a semiconductor device according to claim 1,
wherein nitrogen is introduced in an interface between the oxide film and the semiconductor substrate at 1E11 to 7E14 atoms/cm$^2$.

11. The method of manufacturing a semiconductor device according to claim 1,
wherein nitrogen is introduced in an interface between the oxide film and the semiconductor substrate at 7E12 atoms/cm$^2$.

12. The method of manufacturing a semiconductor device according to claim 1,
wherein the semiconductor substrate is not exposed to the ambient air during the step of introducing nitrogen and the thermally oxidizing process.

13. The method of manufacturing a semiconductor device according to claim 1, wherein the activation process is carried out during 10 seconds or less.

14. A semiconductor device comprising:
a semiconductor substrate; and
an oxide film formed on the semiconductor substrate and having a first surface on a side of said semiconductor substrate and a second surface on an opposite side to said semiconductor substrate, nitrogen being included in the oxide film,
wherein at least a portion of dangling bonds on a surface of the semiconductor substrate that exist at an interface between the semiconductor substrate and the first surface of the oxide film are terminated by nitrogen, and
wherein the nitrogen in the oxide film has, in a direction of a depth in the oxide film, a concentration profile that monotonically increases from the second surface of the oxide film toward the first surface of the oxide film to reach a peak value and then monotonically decreases up to the first surface of the oxide film, said depth being measured perpendicularly to the interface between the semiconductor substrate and the oxide film.

15. The semiconductor device according to claim 14, further comprising:
a gate electrode formed on said oxide film;
wherein the concentration of nitrogen within the interface between the gate electrode and the oxide film is higher than the concentration of nitrogen within the oxide film.

16. The semiconductor device according to claim 15,
wherein the density of the nitrogen that terminates the dangling bonds on the surface of the semiconductor substrate is 1E11 to 7E14 atoms/cm$^2$.

17. The semiconductor device according to claim 16,
wherein the density of the nitrogen that terminates the dangling bonds on the surface of the semiconductor substrate is 7E12 atoms/cm$^2$.

18. The semiconductor device according to claim 14,
wherein the density of the nitrogen that terminates the dangling bonds on the surface of the semiconductor substrate is 1E11 to 7E14 atoms/cm$^2$.

19. The semiconductor device according to claim 18,
wherein the density of the nitrogen that terminates the dangling bonds on the surface of the semiconductor substrate is 7E12 atoms/cm$^2$.

20. The semiconductor device according to claim 14, wherein the concentration of nitrogen in the oxide film is higher than the concentration of nitrogen within the interface between the oxide film and the semiconductor substrate.

21. The semiconductor device according to claim 14, further comprising a gate electrode formed on the oxide film, nitrogen being free from substantial distribution into the gate electrode.

22. The semiconductor device comprising:
a semiconductor substrate, a gate oxide film formed on the semiconductor substrate, and a gate electrode formed on the gate oxide film, the gate oxide film having a first portion on side of the semiconductor substrate and a second portion on side of the gate electrode, each of the first and second portions containing nitrogen therein, the second portion being higher in concentration of nitrogen than the first portion, and nitrogen in the second portion being free from substantial distribution into the gate electrode.

* * * * *